(12) United States Patent
Tobisawa

(10) Patent No.: US 6,551,714 B1
(45) Date of Patent: Apr. 22, 2003

(54) FLAME-RETARDANT RESIN COMPOSITION, AND PREPREGS AND LAMINATES USING SUCH COMPOSITION

(75) Inventor: Akihiko Tobisawa, Fujieda (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/642,156

(22) Filed: Aug. 21, 2000

(30) Foreign Application Priority Data

Jan. 17, 2000 (JP) ........................................ 2000-007515
Mar. 9, 2000 (JP) ........................................ 2000-064370

(51) Int. Cl.$^7$ .............................................. B32B 15/08
(52) U.S. Cl. ....................... 428/416; 428/417; 523/451; 525/481; 525/482; 525/490; 525/523; 528/89; 528/96; 528/108
(58) Field of Search .................. 523/451; 428/416, 428/417; 525/481, 482, 490, 523; 528/89, 96, 108

(56) References Cited

U.S. PATENT DOCUMENTS 5,919,843 A    7/1999   von Gentzkow et al. ... 523/451

FOREIGN PATENT DOCUMENTS

| EP | 0490065 A3  | 6/1992 |
| EP | 0490065 A2  | 6/1992 |
| EP | 0 953 588 A2 | 11/1999 |
| EP | 0 959 088 A2 | 11/1999 |
| JP | 61127748 * | 6/1986 |
| JP | 10-166501 A | 6/1998 |
| JP | 10-195178 A | 7/1998 |
| JP | 11-124489 A | 5/1999 |
| JP | 2000-7898 A | 1/2000 |
| JP | 2000-007898 * | 1/2000 |

OTHER PUBLICATIONS

Database WPI, Section Ch, Week 198917, Derwent Publications Ltd., AN 1989–126740, XP002173635 & JP 01 073651, Mar. 17, 1989.
Database WPI, Section Ch, Week 199007, Derwent Publications Ltd., AN 1990–048171 XP002173636, & JP 02 001149A, Jan. 5, 1990.
European Search Report dated Aug. 17, 2001.
Search Report issued by the Austrian Patent Office Service and Information Sector dated Nov. 16, 2001) under the auspices of the Singapore Patent Office for corresponding Singapore Appln. No. 200004757–1 (dated Oct. 25, 2001).
Abstract for JP 63179920 (which published on Jul. 23, 1998) provided by WPI/Derwent.

* cited by examiner

*Primary Examiner*—Robert Dawson
*Assistant Examiner*—D. Aylward
(74) *Attorney, Agent, or Firm*—Smith, Gambrell & Russell, LLP

(57) ABSTRACT

The present invention provides a resin composition having excellent flame retardancy without using any halogen-containing flame retardant, and prepregs and laminates using such a resin composition. More specifically, the present invention provides a flame-retardant resin composition comprising as essential components (A) an epoxy resin, (B) a curing agent and (C) a phosphorus compound containing at least as part thereof a phosphine oxide compound, a prepreg produced by impregnating this flame-retardant resin composition in a fiber base, and a laminate produced by hot-pressing a single sheet or a pile of two or more sheets of the prepreg.

12 Claims, No Drawings

FLAME-RETARDANT RESIN COMPOSITION, AND PREPREGS AND LAMINATES USING SUCH COMPOSITION

The present invention relates to a resin composition having excellent flame retardancy with no halogen-containing flame retardant incorporated, and prepregs and laminates using such a resin composition.

Owing to their surpassing properties, thermosetting resins represented by epoxy resins are prevalently used for electrical and electronic machine parts, and in many cases these resins are provided with flame retardancy for securing safety against fires in use. Conventionally, the resins have been made flame-retardant by incorporating a halogen-containing compound such as brominated epoxy resin. Although such halogen-containing compounds have high flame retardancy, aromatic bromine compounds have the problem that they not only release corrosive bromine and hydrogen bromide in the course of pyrolysis but also have a possibility of forming highly toxic polybromodibenzofuran and polydibromobenzoxine when decomposed in the presence of oxygen. Further, great difficulty comes in disposing of superannuated wastes containing bromine. For these reasons, study is now being made in earnest on use of phosphorus and nitrogen compounds as well as inorganic fillers as a flame redardant in place of the conventional bromine-containing ones.

As mentioned above, flame retarding of resins can be realized by making use of a phosphorus compound, a nitrogen compound and an inorganic filler. This is based on the concept that the nitrogen and phosphorus compounds accelerate carbonization of a resin to prevent its combustion, while the inorganic fillers help to reduce the amount of a combustible resin by their addition, consequently making the resin less combustible. Inorganic fillers such as metal hydroxides release water when burned to lower temperature and thereby prevent combustion. It has been known in the art, as disclosed in for instance JP-A-10-195178 and JP-A-10-166501, to render resins flame-retardant by incorporating a phosphorus compound and a nitrogen compound along with an inorganic filler instead of using a halogen compound, and prepregs and laminates using such resin compositions have been put to practical use.

The circuit-board manufacturing process involves various chemical liquid treating steps. In the desmearing step, for instance, a basic compound such as sodium hydroxide is required, while use of an oxidizing compound is essential for the blackening treatment. Phosphorus compounds such as phosphoric esters, which are commonly used as a flame retardant, have the problem that they tend to react with the above-mentioned treating compounds to give rise to difficulties.

As a phosphorus compound reactive with epoxy resins and epoxy resin curing agents, other than phosphoric esters, there is known 9,10-dihydro-9-oxa-10-phosphaphenanthrene-10-oxide (produced and sold under the trade name of HCA by Sanko Chemical Co., Ltd.). (See, for example, JP-A-11-124489 and JP-A-2000-7898). HCA is hardly hydrolyzable and has excellent chemical resistance, but it is highly reactive with epoxy resins, so that when HCA alone is used as a phosphorus compound, its content must be increased and the reaction proceeds in the state of precuring varnish with an epoxy resin, and hence the final product such as a laminate may not be provided with the desired properties such as soldering heat resistance.

The present invention has been achieved in the course of studies for solving the above problems, and it provides a resin composition having excellent chemical resistance and flame retardancy by using a phosphine oxide compound with a low tendency to hydrolyze as a phosphorus-containing flame retardant. It is also envisaged in the present invention to provide prepregs using the resin composition, and flame-retardant laminates comprising such prepregs.

Specifically, the present invention provides a flame-retardant resin composition comprising as essential components (A) an epoxy resin, (B) a curing agent, and (C) a phosphorus compound containing at least as a part thereof a phosphine oxide compound. The present invention also provides a prepreg obtained by impregnating the flame-retardant resin composition in a base, and a flame-retardant laminate or a copper-clad flame-retardant laminate produced by hot-pressing a single sheet or a pile of two or more sheets of the prepreg.

As mentioned above, the added type phosphoric esters generally used as a phosphoric flame retardant, such as triphenyl phosphate and cresyl diphenyl phosphate, are easily hydrolyzed and tend to be eluted in a chemical solution. Therefore, resin compositions comprising such compounds as a flame retardant involve problems in their use for laminates.

The phosphine oxide compounds are less susceptible to hydrolysis as they have P-C bonds. These compounds, therefore, unlike the phosphoric esters having P-O bonds, have surpassing chemical resistance. Also, they show satisfactory flame retardancy by addition of only a small quantity because of high phosphorus content.

Generally, phosphorus compounds are hygroscopic, so that too much loading of a phosphorus compound gives adverse effects to moisture resistance and other properties of the cured resin composition. In contrast, phosphine oxide compounds have a restrained tendency to hydrolyze and low hygroscopicity. It is also notable that use of a novolak epoxy resin and a novolak resin as a curing agent makes it possible to provide satisfactory flame retardancy of the composition by addition of a smaller amount of phosphorous compound than required in the conventional art, because these resins have a high content of benzene rings and are therefore high in heat resistance and flame retardancy.

Thus, the flame-retardant resin composition according to the present invention is characterized by use of an epoxy resin and a curing agent with high heat resistance and use of a phosphine oxide compound as a flame retardant to realize satisfactory flame retardancy and chemical resistance of the composition without using a halogen compound.

Examples of the epoxy resins (A) usable in the present invention include bisphenol A epoxy resins, bisphenol F epoxy resins, phenolic novolak epoxy resins, cresol novolak epoxy resins, and bisphenol A novolak epoxy resins, and are not limited to these epoxy resins. It is also possible to use two or more different types of epoxy resins simultaneously.

In view of heat resistance, it is preferred to use the novolak epoxy resins with a high benzene ring content and high heat resistance, especially phenolic novolak epoxy resins and cresol novolak epoxy resins. The phenolic aralkyl epoxy resins represented by the following formula (1), the naphthalene aralkyl epoxy resins represented by the following formula (2) and the biphenyl-modified epoxy resins represented by the following formula (3) are also preferred, as these resins have a high content of aromatic rings and are small in ratio of polar groups, and hence high in heat resistance and capable of reducing water absorption of the composition:

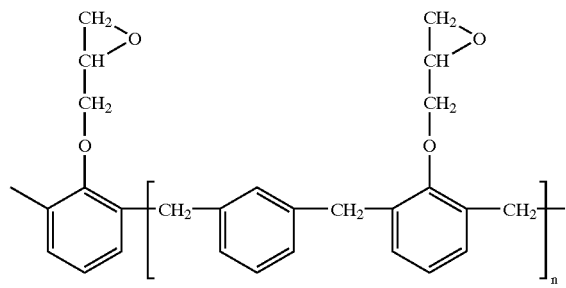

(1)

wherein n is a natural number,

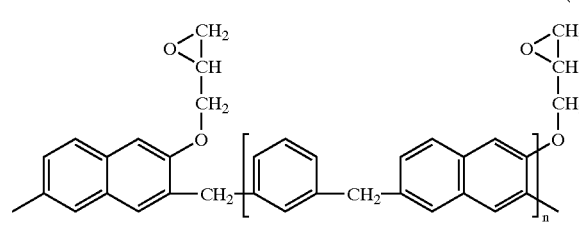

(2)

wherein n is a natural number, and

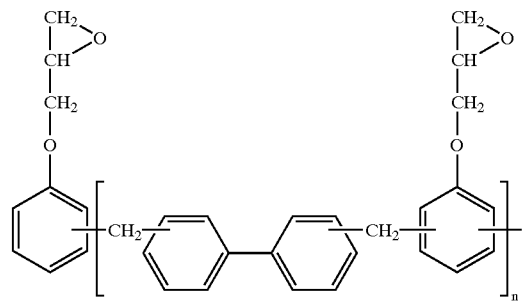

(3)

wherein n is a natural number.

In the present invention, the above type of epoxy resin is preferably used in an amount of at least 50% by weight of the whole epoxy resins for providing the desired improvement of heat resistance and flame retardancy.

As the curing agent used as component (B) in the present invention, novolak resins, amine compounds, acid anhydrides and the like can be used. Novolak resins are preferred, as they have high heat resistance and allow reduction of the amount of the phosphorus compound to be added. Phenolic novolak resins and phenolic aralkyl resins are usually used. Use of a triazine-modified novolak resin represented by the following formula (4) is preferred, as flame retardancy is further improved by the presence of triazine ring which is a nitrogenous component:

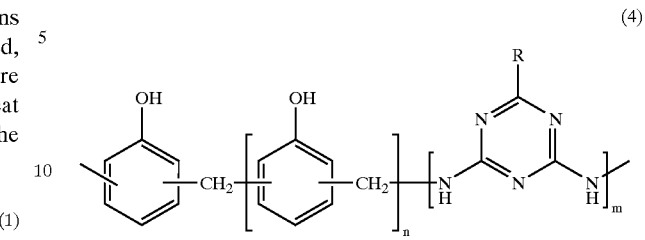

(4)

wherein R is $NH_2$, alkyl group or phenyl group; and m and n are each a natural number.

In view of the fact that a phosphorus compound is contained in the composition, the nitrogen content is preferably selected to be 2.5 to 4% by weight per 100 parts by weight of the epoxy resins, curing agent and phosphorus compound combined. If the nitrogen content is less than 2.5% by weight, desired flame retardancy may not be obtained, and if it exceeds 4.0% by weight, the produced composition tends to have too high hygroscopicity.

The phenolic aralkyl resins represented by the following formula (5), the naphthalene aralkyl resins represented by the following formula (6), the biphenyl-modified novolak resins represented by the following formula (7) and the toluene-, xylene- or mesitylene-modified novolak resins represented by the following formula (8) are also preferred for use in the present invention, as these resins have a high content of aromatic rings and are small in ratio of polar groups, and hence high in heat resistance and conducive to the reduction of water absorption of the composition:

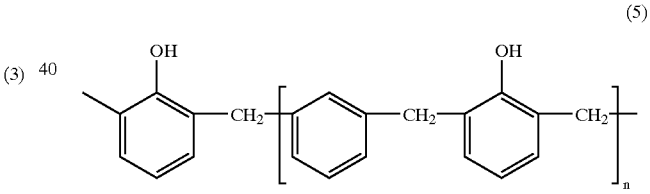

(5)

wherein n is a natural number,

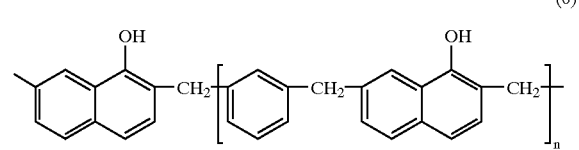

(6)

wherein n is a natural number,

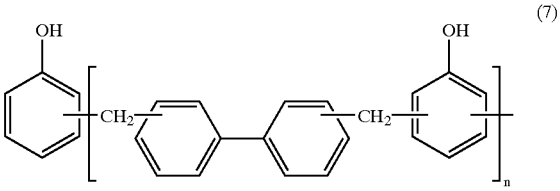

(7)

wherein n is a natural number, and

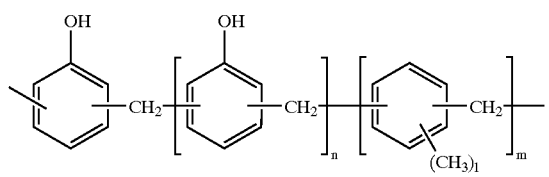

(8)

wherein m and n are each a natural number, and l is a number of 1, 2 or 3.

In case novolak resins are used as curing agent (B), it is preferable to use a combination of (a) a triazine-modified novolak resin of the formula (4) and (b) at least one member selected from the group consisting of phenolic aralkyl resins of the formula (5), naphthalene aralkyl resins of the formula (6), biphenyl-modified novolak resins of the formula (7) and toluene-, xylene- or mesitylene-modified novolak resins of the formula (8), as this combination of novolak resins has high heat resistance and excellent flame retardancy. The preferred (a)/(b) ratio is 60/40 to 20/80 in view of the above properties.

When novolak resins are used as a curing agent, the ratio of novolak resins to epoxy resins is preferably 0.8–1.2 in terms of equivalent ratio (phenolic hydroxyl group/epoxy group). If this ratio is outside the above-defined range, the free epoxy groups or phenolic hydroxyl groups remain in the composition to give adverse effects to its heat resistance and water absorption.

In the present invention, a phosphine oxide compound (C) is used as a phosphorus compound acting as a flame retardant. Phosphine oxide compounds are hardly hydrolyzed and have high chemical resistance. Typical examples of such phosphine oxide compounds are triphenyl-phosphine oxide and tricresylphosphine oxide. Use of 9,10-dihydro-9-oxa-10-phosphaphenanthrene-10-oxide (HCA), a phosphorus compound which, like said phosphine oxide compounds, is hardly hydrolyzed and has high chemical resistance, in combination with said phosphine oxide compound is a preferred embodiment of the present invention.

In the present invention, the phosphorus content provided by the phosphorus compounds such as phosphine oxide compound (C) is preferably 0.5–3% by weight per 100 parts by weight of the epoxy resins, curing agent and phosphorus compounds combined. If the phosphorus content is less than 0.5% by weight, desired flame retardancy may not be obtained, and if it exceeds 3.0% by weight, the produced composition tends to have too high hygroscopicity.

The flame-retardant resin composition of the present invention comprises as its essential components an epoxy resin, a curing agent and a phosphorus compound functioning as a flame retardant as mentioned above, but it is possible to add other types of epoxy resin and curing agent, or other types of resin and curing agent, curing accelerator, coupling agent or other necessary components within limits not prejudicial to the object of the present invention. In the present invention, however, it is preferred not to add phosphoric esters so as not to deteriorate the innate properties, especially chemical resistance, of the resins and laminates. According to the present invention, excellent flame retardancy can be realized although no phosphoric ester is contained in the composition.

The flame-retardant resin composition of the present invention finds various ways of utilization. In case the composition is impregnated in a fiber base, it is usually used in the form of a varnish prepared by dissolving the composition in a solvent. As the solvent, there is usually used one having a high capability to dissolve the composition, but use of a poor solvent is not excluded as far as it does not cause any adverse effect.

The varnish obtained by dissolving the flame-retardant resin composition of the present invention in a solvent may be applied on or impregnated in a base such as woven glass fabric, non-woven glass fabric, or woven or non-woven fabrics made of other materials than glass fiber, and dried at 80 to 200° C. to make a prepreg. Such a prepreg may be hot-pressed to produce a laminate or a copper-clad laminate. The flame-retardant resin composition according to the present invention is a thermosetting resin composition having outstanding flame retardancy without containing any halogen compound, and is especially suited for use as a base material of prepregs and laminates for printed circuit boards.

The present invention will be described in further detail below with reference to the examples thereof.

EXAMPLE 1

100 parts by weight of a phenolic novolak epoxy resin (Epiclon N-770 produced by Dainippon Ink and Chemicals, Inc.), 49 parts by weight of a phenolic aralkyl resin (Milex XLC-LL produced by Mitsui Chemical Co., Ltd.), 31 parts by weight of a triazine-modified phenolic novolak resin (LA-7054 produced by Dainippon Ink and Chemicals, Inc.) and 40 parts by weight of triphenylphosphine oxide were dissolved in methyl cellosolve to prepare a varnish with a nonvolatile concentration of 60% by weight. The varnish had a phosphorus content of 2.0% by weight and a nitrogen content of 1.7% by weight per 100% by weight of the epoxy resin, curing agent and phosphorus compound combined.

This varnish was impregnated, in an amount of 80 parts by weight as solids, in 100 parts by weight of a woven glass fabric (0.18 mm thick, manufactured by Nitto Boseki KK) and dried in a 150° C. drying oven for 5 minutes to make a prepreg with a resin content of 44.4% by weight.

6 sheets of this prepreg were placed one over another, with a 35 μm thick electrolytic copper foil placed on the top and at the bottom of the pile, and subjected to hot compression molding under the conditions of 40 kgf/cm$^2$ and 190° C. for 120 minutes to obtain a 1.2 mm thick double-side copper-clad laminate.

EXAMPLES 2–6 and Comparative Examples 1–4

The resin compositions of the formulations shown in Table 1 (Examples) and Table 2 (Comparative Examples) were dissolved in methyl cellosolve to prepare varnishes with a nonvolatile concentration of 60% by weight. Thereafter the same procedure as in Example 1 was repeated to make double-side copper-clad laminates.

Flame retardancy, soldering heat resistance, copper foil peel strength and chemical resistance of the obtained copper-clad laminates were determined. Results of evaluation are shown in Tables 1 and 2. Determination of the above properties was made as described below.

1. Flame Retardancy

This was evaluated by the vertical flame method according to UL-94 standards.

2. Soldering Heat Resistance

This was determined according to JIS C-6481. Each test piece, which had been subjected to a moisture absorbing treatment by 2-hour boiling, was immersed in a 260° C. solder bath for 120 seconds and examined for abnormality of external appearance.

3. Copper Foil Peel Strength

This was determined according to JIS C-6481.

4. Chemical Resistance

Per cent loss in weight after 10-minute immersion in a 20 wt % aqueous solution of sodium hydroxide of 80° C. (a) and per cent loss in weight after 96-hour immersion in a 20 wt % aqueous solution of potassium persulfate of 70° C. (b) were determined.

2) Epiclon N-690 produced by Dainippon Ink and Chemicals, Inc., epoxy equivalent: 210

3) ESN-155 produced by Shin Nittetsu Chemical Co., Ltd., epoxy equivalent: 275

4) NC-3000P produced by Nippon Kayaku KK, epoxy equivalent: 275

5) Milex XLC-LL produced by Mitsui Chemical Co., Ltd., hydroxy equivalent: 175

6) LA-7054 produced by Dainippon Ink and Chemicals, Inc., hydroxy equivalent: 125; nitrogen content: 12 wt %

7) PR-51470 produced by Sumitomo Durez Co., Ltd., hydroxy equivalent: 105

8) R-54537 produced by Sumitomo Durez Co., Ltd., hydroxy equivalent: 190

9) 9,10-dihydro-9-oxa-10-phosphaphenanthrene-10-oxide

As seen from Tables 1 and 2, any of the copper-clad laminates obtained in the Examples has excellent flame retardancy, soldering heat resistance and chemical resistance.

TABLE 1

| Items | | Example 1 | Example 2 | Example 3 | Example 4 | Example 5 | Example 6 |
|---|---|---|---|---|---|---|---|
| Formulation (part by weight) | Phenolic novolak epoxy resin [1] | 100 | | | | | |
| | Cresol novolak epoxy resin [2] | | 100 | | | | 100 |
| | Naphthalene aralkyl epoxy resin [3] | | | 100 | | | |
| | Biphenyl-modified epoxy resin [4] | | | | 100 | 100 | |
| | Phenolic aralkyl resin [5] | 49 | 52 | 39 | | | 38 |
| | Triazine-modified phenolic novolak resin [6] | 31 | 15 | 23 | | | 26 |
| | Phenolic novolak resin [7] | | | | 38 | | |
| | Xylene-modified novolak resin [8] | | | | | 71 | |
| | HCA [9] | | | | | 17 | 11 |
| | Triphenylphosphine oxide | 40 | 38 | 35 | 30 | 15 | 20 |
| Phosphorus (wt %) | | 2.0 | 2.1 | 2.0 | 2.0 | 2.0 | 1.9 |
| Nitrogen (wt %) | | 1.7 | 0.9 | 1.4 | 0.0 | 0.0 | 1.6 |
| Properties | Flame retardancy (UL94) | V-0 | V-0 | V-0 | V-0 | V-0 | V-0 |
| | Soldering heat resistance | No abnormality | No abnormality | No abnormality | No abnormality | No abnormality | No abnormality |
| | Copper foil peel strength (kN/m) | 1.5 | 1.4 | 1.5 | 1.3 | 1.4 | 1.4 |
| | Chemical resistance (per cent loss in weight) | | | | | | |
| | (a) Sodium hydroxide | 0.15 | 0.14 | 0.13 | 0.13 | 0.13 | 0.15 |
| | (b) Potassium persulfate | 0.05 | 0.05 | 0.05 | 0.04 | 0.03 | 0.04 |

TABLE 2

| Items | | Comp. Example 1 | Comp. Example 2 | Comp. Example 3 | Comp. Example 4 |
|---|---|---|---|---|---|
| Formulation (part by weight) | Phenolic novolak epoxy resin [1] | 100 | | | |
| | Cresol novolak epoxy resin [2] | | 100 | 100 | 100 |
| | Phenolic aralkyl resin [5] | 32 | 32 | 40 | 38 |
| | Triazine-modified phenolic novolak resin [6] | 35 | 37 | 29 | 26 |
| | Triphenyl phosphate | | | 40 | 20 |
| | HCA [9] | | | | 11 |
| Phosphorus (wt %) | | 0.0 | 0.0 | 1.8 | 2.0 |
| Nitrogen (wt %) | | 2.5 | 2.6 | 1.7 | 1.6 |
| Properties | Flame retardancy (UL94) | HB | HB | V-0 | V-0 |
| | Soldering heat resistance | No abnormality | No abnormality | No abnormality | No abnormality |
| | Copper foil peel strength (kN/m) | 1.5 | 1.4 | 1.4 | 1.3 |
| | Chemical resistance (per cent loss in weight) | | | | |
| | (a) Sodium hydroxide | 0.15 | 0.14 | 0.98 | 0.85 |
| | (b) Potassium persulfate | 0.02 | 0.05 | 0.35 | 0.25 |

Notes in Tables 1 and 2:

1) Epiclon N-770 produced by Dainippon Ink and Chemicals, Inc., epoxy equivalent: 190

As described above, the flame-retardant resin composition according to the present invention, without containing any halogen compound, has surpassing flame retardancy and also excels in other properties such as heat resistance. Thus, the present invention provides a novel thermosetting resin composition useful as a halogen-free material which is expected to rise in demand in the future. The prepregs and laminates produced from the above resin composition, and the printed circuit boards comprising such laminates, are also excellent in not only flame retardancy but also other properties such as soldering heat resistance.

What is claimed is:

1. A flame-retardant resin composition consisting essentially of (A) an epoxy resin, (B) a curing agent, and (C) a phosphorus compound, wherein the phosphorous compound (C) comprises a phosphine oxide compound and 9,10-dihydro-9-oxa-10-phosphaphenanthrene-10-oxide.

2. A prepreg obtained by impregnating a flame-retardant resin composition as set out in claim 1 in a fiber base.

3. A laminate characterized in that a single sheet or a pile of two or more sheets of the prepreg as set out in claim 2 is hot-pressed.

4. A copper-clad laminate characterized in that a single sheet or a pile of two or more sheets of the prepreg as set out in claim 2 is hot-pressed.

5. A flame-retardant resin composition according to claim 1, wherein part or whole of the epoxy resin (A) is at least one member selected from the group consisting of phenolic aralkyl epoxy resins represented by the formula (1), naphthalene aralkyl epoxy resins represented by the formula (2) and biphenyl-modified epoxy resins represented by the formula (3):

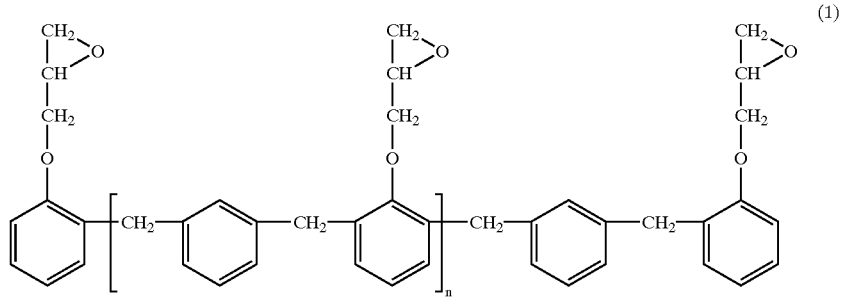

(1)

wherein n is a natural number,

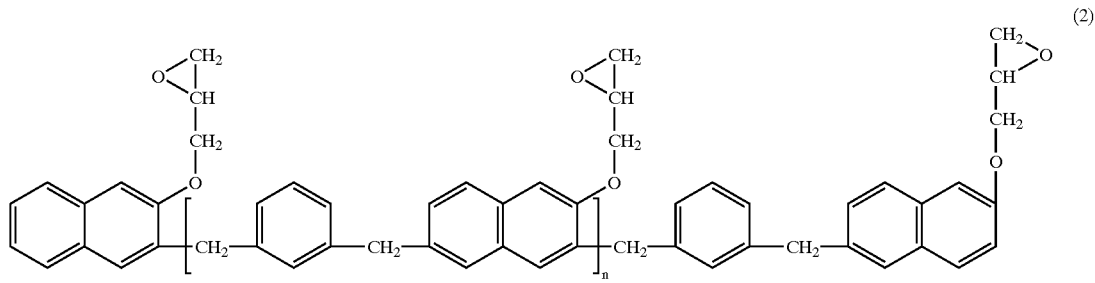

(2)

wherein n is a natural number, and

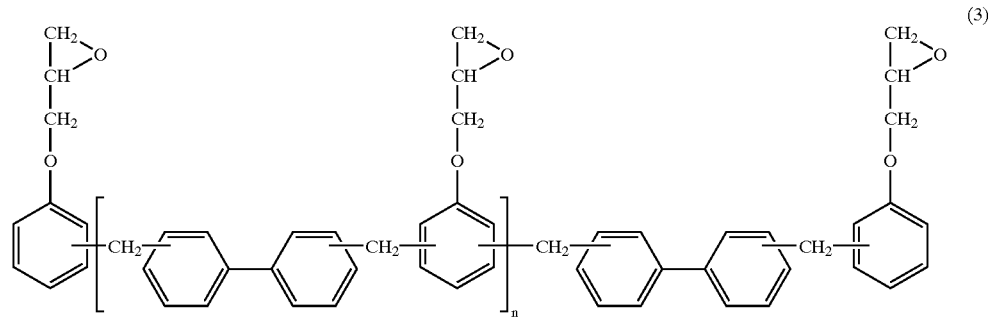

(3)

wherein n is a natural number.

6. A flame-retardant resin composition according to claim 1, wherein part or whole of the curing agent (B) is a triazine-modified novolak resin represented by the formula (4):

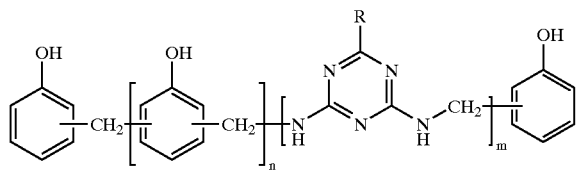
(4)

wherein R is NH$_2$, alkyl group or phenyl group; and m and n are each a natural member.

7. A flame-retardant resin composition according to claim 1, wherein part or whole of the curing agent (B) is at least one member selected from the group consisting of phenolic aralkyl resins represented by the formula (5), naphthalene aralkyl resins represented by the formula (6), biphenyl-modified novolak resins represented by the formula (7) and toluene-, xylene- or mesitylene-modified novolak resins represented by the formula (8):

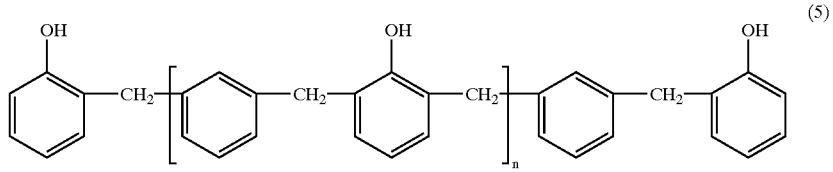
(5)

wherein n is a natural number,

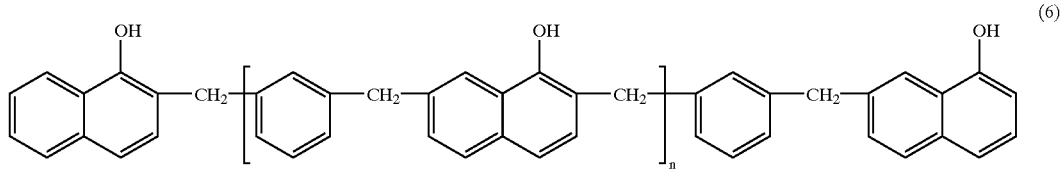
(6)

wherein n is a natural number,

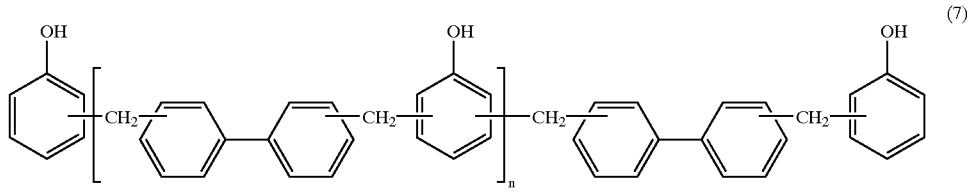
(7)

wherein n is a natural number, and (8)

wherein m and n are each a natural number, and l is a number of 1, 2 or 3.

8. A flame-retardant resin composition according to claim 1, wherein part or whole of the epoxy resin (A) is a novolak epoxy resin.

9. A flame-retardant resin composition according to claim 1, wherein part or whole of the epoxy resin (A) is a phenolic novolak epoxy resin, a cresol novolak epoxy resin, or a mixture of a phenolic novolak epoxy resin and a cresol novolak epoxy resin.

10. A flame-retardant resin composition according to claim 1, wherein part or whole of the curing agent (B) is a novolak resin.

11. A flame-retardant resin composition according to claim 1, wherein a triazine-modified novolak resin of the formula (4) and at least one resin selected from phenolic aralkyl resins of the formula (5), naphthalene aralkyl resins of the formula (6), biphenyl-modified novolak resins of the formula (7) and toluene-, xylene- or mesitylene-modified novolak resin of the formula (8) area used in combination as the curing agent.

12. A flame-retardant resin composition according to claim 1, wherein the phosphine oxide compound is triphenylphoshine oxide.

* * * * *